United States Patent
Kaußler

(10) Patent No.: US 10,882,475 B2
(45) Date of Patent: Jan. 5, 2021

(54) MULTI-VOLTAGE CONTROL DEVICE FOR A MOTOR VEHICLE, MOTOR VEHICLE AND OPERATING METHOD FOR THE CONTROL DEVICE

(71) Applicant: AUDI AG, Ingolstadt (DE)

(72) Inventor: Richard Kaußler, Schernfeld (DE)

(73) Assignee: Audi AG, Ingolstadt (DE)

( * ) Notice: Subject to any disclaimer, the term of this patent is extended or adjusted under 35 U.S.C. 154(b) by 122 days.

(21) Appl. No.: 16/307,846

(22) PCT Filed: May 29, 2017

(86) PCT No.: PCT/EP2017/062899
§ 371 (c)(1),
(2) Date: Feb. 15, 2019

(87) PCT Pub. No.: WO2018/001665
PCT Pub. Date: Jan. 4, 2018

(65) Prior Publication Data
US 2019/0308572 A1    Oct. 10, 2019

(30) Foreign Application Priority Data

Jun. 28, 2016 (DE) .................. 10 2016 007 900

(51) Int. Cl.
*B60R 16/023* (2006.01)
*B60R 16/03* (2006.01)
(Continued)

(52) U.S. Cl.
CPC .......... *B60R 16/0232* (2013.01); *B60R 16/03* (2013.01); *G01R 31/50* (2020.01);
(Continued)

(58) Field of Classification Search
CPC ............ H02H 3/20; H02H 3/202; H02H 3/26; H02H 7/22; H02H 5/105; H02P 2101/45;
(Continued)

(56) References Cited

U.S. PATENT DOCUMENTS 5,410,441 A    4/1995  Allman
6,127,830 A   10/2000  Engelmann et al.
(Continued)

FOREIGN PATENT DOCUMENTS

DE    19529433 A1    2/1997
DE    19644181 A1    4/1998
(Continued)

OTHER PUBLICATIONS

International Search Report and Written Opinion of the International Search Authority directed to related International Patent Application No. PCT/EP2017/062899, dated Aug. 28, 2017, with attached English-language translation; 26 pages.

(Continued)

*Primary Examiner* — Arnold M Kinkead
(74) *Attorney, Agent, or Firm* — Sterne, Kessler, Goldstein & Fox P.L.L.C.

(57) ABSTRACT

The disclosure relates to a control device for a motor vehicle which comprises a first electrical terminal for receiving a first supply voltage of a first vehicle electrical system and a second electrical terminal for receiving a second supply voltage of a second vehicle electrical system, the second supply voltage being smaller than the first supply voltage, wherein an electrical ground terminal is provided for closing a common ground potential of the first and second vehicle electrical systems, and a switching device connected downstream of the first terminal is set up, depending on a voltage signal which is determined by a potential difference between the second terminal and the ground terminal, to block a (Continued)

current flow through the first terminal, wherein the switching device interrupts the current flow if the voltage signal indicates an interruption of an electrical connection between the ground terminal and the ground potential.

20 Claims, 2 Drawing Sheets

(51) Int. Cl.
| | |
|---|---|
| *H02H 7/22* | (2006.01) |
| *H02J 1/00* | (2006.01) |
| *H02J 1/08* | (2006.01) |
| *H02H 5/10* | (2006.01) |
| *G01R 31/50* | (2020.01) |
| *H02H 3/20* | (2006.01) |
| *G01R 31/52* | (2020.01) |
| *G01R 31/00* | (2006.01) |

(52) U.S. Cl.
CPC ............ *G01R 31/52* (2020.01); *H02H 3/202* (2013.01); *H02H 5/105* (2013.01); *H02H 7/22* (2013.01); *H02J 1/00* (2013.01); *H02J 1/08* (2013.01); *G01R 31/006* (2013.01); *H02J 1/082* (2020.01); *H02J 2310/40* (2020.01); *H02J 2310/46* (2020.01)

(58) Field of Classification Search
CPC ..... H02P 23/24; H02J 1/00; H02J 1/08; H02J 1/082; H02J 2310/46; H02J 2310/40; B60R 16/0232; B60R 16/03; G01R 31/50; G01R 31/52; G01R 31/006
USPC .... 323/285, 274, 276, 267, 266; 307/64, 85, 307/10.8, 10.1, 66; 361/91, 111, 56, 86, 361/18
See application file for complete search history.

(56) References Cited

U.S. PATENT DOCUMENTS

| | | | |
|---|---|---|---|
| 6,201,479 | B1 | 3/2001 | Zydek et al. |
| 6,639,389 | B2 | 10/2003 | Binder et al. |
| 7,675,726 | B2 | 3/2010 | Bolz et al. |
| 8,779,735 | B2 * | 7/2014 | Roessler ............ H03K 17/0822 323/271 |
| 9,310,411 | B2 | 4/2016 | Mehringer et al. |
| 9,941,692 | B2 | 4/2018 | Walter |
| 10,103,662 | B2 | 10/2018 | Eschenhagen |
| 2009/0015973 | A1 | 1/2009 | Trunk et al. |

FOREIGN PATENT DOCUMENTS

| | | |
|---|---|---|
| DE | 19929305 A1 | 12/2000 |
| DE | 102013006696 A1 | 11/2013 |
| DE | 102014017571 A1 | 6/2016 |
| EP | 1067647 A2 | 1/2001 |
| EP | 1241768 A2 | 9/2002 |
| EP | 1453171 A1 | 1/2004 |
| JP | 2004203091 A | 7/2004 |
| WO | WO 0145224 A2 | 6/2001 |
| WO | WO 2005013453 A1 | 2/2005 |
| WO | WO 2006058824 A2 | 6/2006 |
| WO | WO 2013010694 A1 | 1/2013 |
| WO | WO 2013050207 A1 | 4/2013 |
| WO | WO 2015014551 A1 | 2/2015 |
| WO | WO 2015071127 A1 | 5/2015 |

OTHER PUBLICATIONS

International Preliminary Report on Patentability of the International Search Authority directed to related International Patent Application No. PCT/EP2017/062899, dated Jan. 10, 2019; 8 pages.

* cited by examiner

MULTI-VOLTAGE CONTROL DEVICE FOR A MOTOR VEHICLE, MOTOR VEHICLE AND OPERATING METHOD FOR THE CONTROL DEVICE

TECHNICAL FIELD

The present application relates to a control device for a motor vehicle, which is connected to two different electrical systems of the motor vehicle.

BACKGROUND

The control device may be, for example, a control apparatus. A respective electrical current received from the first and the second vehicle electrical system flows via a ground connection into a common ground potential of the first and the second vehicle electrical system. The application also includes a motor vehicle with the two on-board networks and the control device according to the application. Finally, the application also includes a method for operating the control device.

A multi-voltage supply for a control device may be provided, for example, when the control apparatus controls an electrical load based on a first supply voltage, for example an electric machine, and an internal control circuit of the control device itself is to be operated with the lower second supply voltage.

In control apparatus or general control devices with a multi-volt supply, for example, a 12 volt and a 48 volt supply, a potential separation of the two circuits must as a rule be carried out, which forms the control device with the two on-board networks. The potential separation also results in a separate grounding to two separate ground terminals of the control device. In contrast, the ground potential of the motor vehicle is often shared by the two on-board networks.

BRIEF DESCRIPTION OF THE DRAWINGS/FIGURES

DETAILED DESCRIPTION

Figure 1:
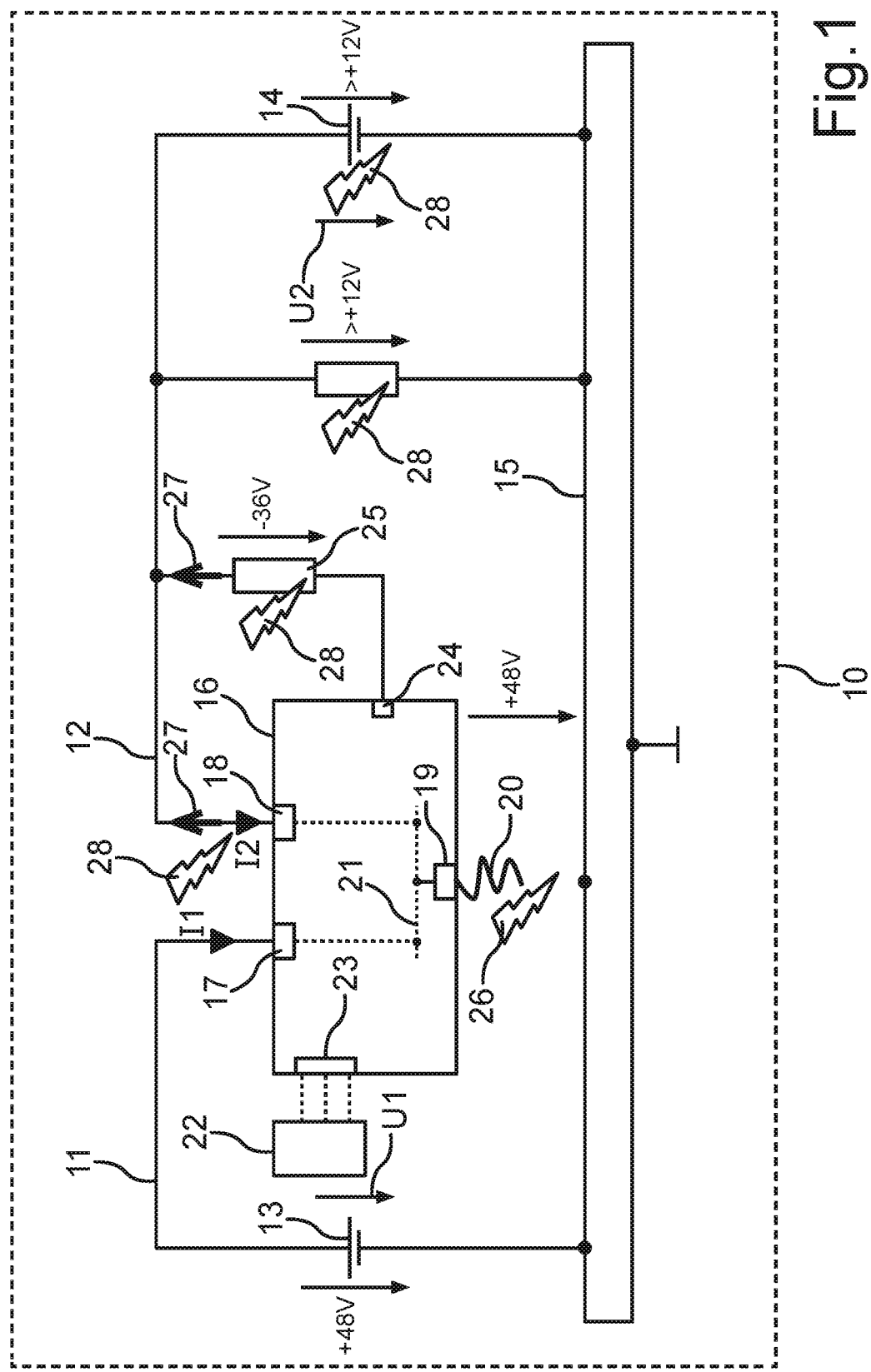
FIG. 1 shows a schematic representation of an embodiment of the motor vehicle according to an embodiment of the invention.

The present application relates to a control device for a motor vehicle, which is connected to two different electrical systems of the motor vehicle. The control device may be, for example, a control apparatus. A respective electrical current received from the first and the second vehicle electrical system flows via a ground connection into a common ground potential of the first and the second vehicle electrical system. The application also includes a motor vehicle with the two on-board networks and the control device according to the application. Finally, the application also includes a method for operating the control device.

A multi-voltage supply for a control device may be provided, for example, when the control apparatus controls an electrical load based on a first supply voltage, for example an electric machine, and an internal control circuit of the control device itself is to be operated with the lower second supply voltage.

In control apparatus or general control devices with a multi-volt supply, for example, a 12 volt and a 48 volt supply, a potential separation of the two circuits must as a rule be carried out, which forms the control device with the two on-board networks. The potential separation also results in a separate grounding to two separate ground terminals of the control device. In contrast, the ground potential of the motor vehicle is often shared by the two on-board networks.

The reason for the potential separation is that in case of interruption of the electrical connection between the ground terminals of the control device on the one hand and the ground potential on the other hand, in general a large circuit results, which runs via the first electrical system with the larger supply voltage (e.g. 48 volts) via the control device to the second electrical system with the smaller supply voltage (e.g. 12 volts) and only from there via the ground potential back to the first electrical system. Without a potential separation within the control device, in the second electrical system (12 volts) there would be feedback of the first supply voltage (48 volts) through which the voltage of the first electrical system with opposite sign, that is, as a negative voltage, would act on the second electrical system. In a combination of a first electrical system with a 48 volt supply voltage and a second electrical system with a 12 volt supply voltage, there may thus be a voltage drop of −36 V over the electrical loads of the second electrical system.

However, these loads are often not protected for cost reasons. Therefore, the solution of potential separation with two separate ground connections used today for a control device is the most cost-effective and safest solution. It prevents feedback.

A control device having a multi-voltage supply is known, for example, from WO 2005/013453 A1. This control device has a protection circuit in the event that an electrical load controlled by the control device generates a short circuit in one of the on-board systems.

A control device for operation on multiple on-board networks of different supply voltage is also known from EP 1 453 171 A1. This control device also has an electronic protection circuit for protection against a short circuit in an electrical load, by means of which current flow through the control device could exceed a threshold value. The control device has two separate ground connections.

From DE 199 29305 A1 a jumper cable with integrated switching device for interrupting a current flow on the basis of MOSFET switches is known.

The application has as its object to provide, in a control device, protection in the event that the control device is operated with two different supply voltages and there is an electrical interruption between a ground terminal of the control device and a ground potential of the motor vehicle.

The object is achieved by the subject-matter of the independent patent claims. Advantageous developments of the application are described by the dependent claims, the following description and the figures.

The application provides a control device for a motor vehicle. The control device may be, for example, a control apparatus. The control device has two electrical connections for receiving a respective supply voltage. A first electrical connection is set up for receiving a first supply voltage of a first electrical vehicle electrical system of the motor vehicle. The first supply voltage may be, for example, an electrical DC voltage in a range of 30 volts to 60 volts, for example 48 volts, or an electrical high voltage, that is, an electrical voltage greater than 60 volts. A second electrical connection is designed to receive a second supply voltage of a second electrical system of the motor vehicle. The second supply voltage is smaller than the first supply voltage. The second supply voltage may be, for example, a DC electrical voltage in a range of 10 volts to 50 volts, for example a 12 volt voltage. The control device further comprises an electrical ground terminal for connecting a common ground potential of the first and the second electrical system.

As protection against the described feedback, a switching device is connected downstream of the first connection, which is configured to interrupt or block current flow through the first connection depending on a voltage signal. The voltage signal is such a signal depending on a potential difference between the second terminal and the ground terminal. If, therefore, the potential difference between the second connection and the ground connection changes, so does the voltage signal. If the voltage signal satisfies a predetermined switching condition, the current flow through the first terminal is blocked by the switching device. The switching device is set up such that it interrupts the current flow if the voltage signal indicates an interruption of an electrical connection between the ground terminal and the ground potential. Which signal values the voltage signal can have in this case can be determined by simple experiments.

In particular, it is provided that the switching device interrupts the current flow if the potential difference is negative, i.e. if (with respect to the ground potential) a potential of the ground terminal is greater in magnitude than a potential of the second terminal, as is the case when the ground terminal has a potential corresponding to the potential of the first terminal. For example, if the ground potential of the motor vehicle to 0 volts and the first supply voltage and the second supply voltage as a ground potential are greater than 0, the potential difference between the second terminal and the ground terminal is positive and is the value of the second supply voltage. When the electrical connection between ground terminal and ground potential is interrupted, the ground terminal can have the potential of the first electrical connection. Since the first supply voltage is greater than the second supply voltage, the potential difference between the first terminal and ground terminal is negative.

The application results in the advantage that no potential separation within the control device is necessary and still if there is an interruption of the electrical connection between the ground terminal of the control device and the ground potential of the motor vehicle, the described feedback cannot occur, by which the first supply voltage of the first electrical system might influence the electrical loads of the second electrical system.

The application also includes advantageous developments, the characteristics of which provide additional advantages.

With this effective protection is therefore preferably also provided that the ground terminal is intended to close the circuits of both the first and second electrical systems. In particular, the ground terminal is provided as a single ground terminal. In other words, the two vehicle electrical systems are electrically coupled via a device-internal ground line element of the control device. Such a ground line element may be, for example, a bus bar or an electrical wire or a metal layer of a printed circuit board (PCB). This eliminates the need for dual cabling for two ground connections.

In particular, it is provided that said switching device for interrupting a current flow at the first terminal is arranged in the control device such that it is connected between the first terminal and a control output. The control output is an electrical connection to which an electrical apparatus of the first electrical system can be connected, for, e.g. an electric machine. Through the control output, the control device controls this electrical apparatus of the first electrical system. In other words, the control output is controlled by the control device, that is to say an electrical voltage provided at the control output and/or an electric current provided at the control output is set by the control device. Now the switching device between the first terminal, over which the first supply voltage is received, and this control output is switched by switching the switching device, so that the current flow is interrupted, and even the electrical apparatus connected to the control output is switched off or de-energized, regardless of whether the electrical apparatus is defective or not.

It is preferably provided that the switching device has a transistor for interrupting the current flow. It is preferably provided that a MOSFET (Metal Oxide Semiconductor Field Effect Transistor) is provided as the transistor. This results in the advantage that the switching device can switch so quickly, that is, can interrupt the current flow, that damage to electrical loads of the second electrical system is unlikely. In particular, the switching duration is less than 100 milliseconds, in particular less than 50 milliseconds.

The switching device is controlled by the described voltage signal or switched in response to the voltage signal. The voltage signal describes the potential difference between the second electrical terminal and the ground terminal. To detect this voltage signal, the control circuit preferably has a control transistor. This transistor is called a control transistor because it should be a transistor other than the described transistor for interrupting the current flow itself. The control transistor is connected in such a way that the voltage signal drops between its gate and source connection. Thus, the control transistor is switched or controlled directly by the voltage signal. In the case of an electrical connection between the ground terminal and ground potential, a positive gate-source voltage results and the control transistor switches through. Upon interruption of the electrical connection between the ground terminal and ground potential there is a negative gate-source voltage and the control transistor between is blocked. This can be used directly to switch or control the gate of the described other transistor to interrupt the current flow itself. For this purpose, the gate of the other transistor can be connected to the ground terminal via the drain-source path of the control transistor.

Another advantage of a control transistor is that the switching device can also be switched independently of the voltage signal by at least one further switching signal of another signal source. In other words, the control transistor provides for decoupling. Thus, it is preferably provided that the switching device is adapted to receive a respective switching signal from at least one further signal source in order to switch the switching device independently of said potential difference as well, depending on the respective switching signal. For this purpose the switching signal is received via a respective further control transistor. Thus, the switching device can also be used to switch the current flow of the supply current received via the first connection even in the fault-free case, i.e. in the case of an electrical connection between ground terminal and ground potential.

As a signal source, according to an embodiment of the invention, there is provided a test device for switching the switching device, which switches the switching device if a predetermined test condition independent of the potential difference is satisfied. The test device can be designed, for example, as a program module of a microcontroller or microprocessor of the control device. Thus, for example, a self-test of the control device may be provided as a test condition, as may be provided, for example, during start-up of the control device and/or at predetermined time intervals.

It has proved to be particularly advantageous if the switching device has a capacitor between whose electrodes the voltage signal drops. In other words, for example, it can be connected to the described control transistor between the gate and source of the capacitor. The advantage of the capacitor is that sporadic voltage peaks do not lead to undesired false triggering of the switching device, that is to say to an undesirable, unnecessary interruption of the current flow at the first connection.

As already stated, an embodiment of the invention also encompasses a motor vehicle which has a first electrical vehicle system for providing a first supply voltage and a second electrical vehicle system for providing a second electrical supply voltage. The second supply voltage is smaller than the first supply voltage. Furthermore, a ground potential for both vehicle electrical systems is provided. The ground potential can be formed for example by the body of the motor vehicle or a frame of the motor vehicle. To the first and the second electrical system and the ground potential, an embodiment of the control device according to an embodiment of the invention is connected. The control device advantageously prevents backfeed of the first supply voltage to the second vehicle electrical system occurring in the event of an interruption of the electrical connection between the ground potential of the motor vehicle and the ground terminal of the control device.

The motor vehicle according to an embodiment of the invention is preferably designed as a motor vehicle, in particular as a passenger car or truck.

Finally, an embodiment of the invention also includes a method for controlling a control device for a motor vehicle. The method presupposes that the control device, via a first electrical connection, receives a first supply voltage of a first electrical system and via a second electrical connection, receives a second supply voltage of a second electrical system. It is again assumed that the second supply voltage is smaller than the first supply voltage. According to the method, an electrical ground terminal is provided for connecting a common ground potential of the first and second systems, and interrupts or blocks a switching device connected downstream of the first connection depending on the described voltage signal, that is, on the potential difference between the second connection and the ground terminal depending on the flow of current through the first connection. In the manner described, the dependence on the voltage signal is designed in such a way that the switching device blocks the current flow if the voltage signal indicates an interruption of an electrical connection between the ground terminal of the control device and the ground potential of the motor vehicle.

The approach also includes further developments of the method according to embodiments of the invention which have features such as have already been described in connection with the further developments of the control device according to embodiments of the invention. For this reason the corresponding further developments of the method according to embodiments of the invention are not described again here.

An exemplary embodiment of the invention is described below.

FIG. 1 shows a schematic representation of an embodiment of the motor vehicle according to an embodiment of the invention.

Figure 2:
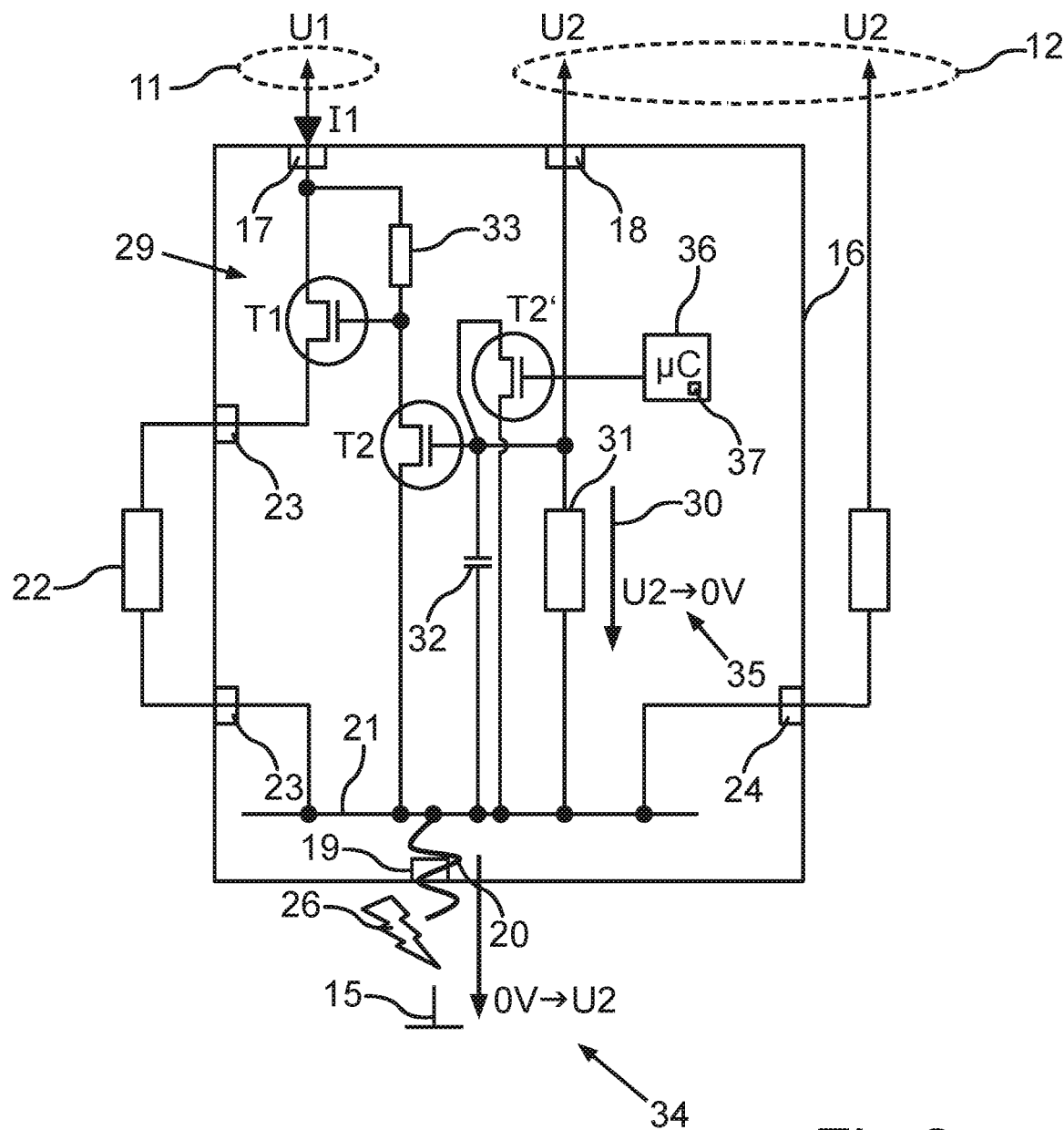
FIG. 2 shows a schematic representation of an embodiment of the control device according to an embodiment of the invention, as can be provided in the motor vehicle of FIG. 1.

FIG. 2 shows a schematic representation of an embodiment of the control device according to an embodiment of the invention, as can be provided in the motor vehicle of FIG. 1.

The exemplary embodiment explained below is an embodiment of the invention. In the exemplary embodiment, the described components of the embodiment each represent individual features of an embodiment of the invention that are to be considered independently of each other, which also develop the invention independently of one another and thus also individually or in a different combination than the one shown as part of an embodiment of the invention. Furthermore, the described embodiment can also be supplemented by further features of embodiments of the invention already described.

In the figures, functionally identical elements are each provided with the same reference numerals.

FIG. 1 shows a motor vehicle 10, which may be a motor vehicle, especially a passenger car. The motor vehicle 10 may have a first vehicle electrical system 11 and a second vehicle electrical system 12. A first voltage source 13 of the first vehicle electrical system 11 can generate a first supply voltage U1 in the first vehicle electrical system 11. The first voltage source 13 may comprise, for example, a generator and/or a battery. A second voltage source 14 of the second vehicle electrical system 12 can generate a second supply voltage U2 in the second vehicle electrical system 12. The second voltage source 14 may comprise, for example, a generator and/or a battery. The second supply voltage U2 is smaller than the first supply voltage U1. In FIG. 1, for the sake of illustration, it is assumed that the first supply voltage U1=48 volts and the second supply voltage U1=12 volts.

For the two vehicle networks 11, 12, a common ground potential 15 is provided in the motor vehicle 10, which may be for connecting a control apparatus, on the basis of a body of the motor vehicle 10. To the two vehicle electrical systems 11, 12, a control device 16 may be connected, which may be a control apparatus, for example. To connect to the first electrical system 11, the control device 16 may have a first terminal 17; to connect to the second electrical system 12, it may have a second terminal 18. To connect the control device 16 to the ground potential 15, a ground terminal 19 may be provided, to which an electrical connection 20 for linking to the ground potential 15 may be connected. The electrical connection 20 can be formed for example by a wire or a screw or a flex strip. Within the control device 16, a supply current I1 received from the first vehicle electrical system 11 and a supply current I2 received from the second vehicle electrical system 12 can be conducted to the ground terminal 19 via a ground line element 21.

FIG. 1 shows by way of example that through the control device 16, a first apparatus 22 can be connected to a control terminal 23 of the control device 16 and in this way can be switched or control via the control terminal or control output 23 by the control device 16. For example, the apparatus 22 may be an electric machine, for example an electric motor for assisting an internal combustion engine of the motor vehicle 10. Via a second control terminal or control output 24, a second apparatus 25 of the second vehicle electrical system 12 can be controlled by the control device 16.

FIG. 1 illustrates an error case in which an interruption 26 of the electrical connection 20 between the ground terminal 19 and the ground potential 15 has come about. If no protective measure is provided in the control device 16, via the ground line element 21, an electrical connection between the first connection 17 and the second connection 18 can cause the first supply voltage U1 to act on the second on-board network 12 through the feedback 27.

This can lead to an error voltage 28 for which exemplary values (minus 36 volts and greater than +12 volts) are given in FIG. 1 for the case U1=48 volts, U2=12 volts described at the outset.

In the control device 16, this feedback 27 is effectively prevented. This is explained below with reference to FIG. 2.

FIG. 2 shows the control device 16 in which a switching device 29 can be provided. The switching device 29 may be connected between the first terminal 17 and the control terminal 23. The switching device 29 may comprise a transistor T1 for switching a current flow of the supply current 11. The transistor T1 may be a MOSFET. The transistor T1 is in particular a p-channel MOSFET. The first terminal 17 and the control output 23 can be connected via a drain-source path of the transistor T1. A gate-source voltage of the transistor T1 can be switched or set or controlled by means of a control transistor T2. The transistor T2 is in particular an n-channel MOSFET. The transistor T2 only needs to be a small-signal transistor, that is, it does not have to be able to switch or block the first supply voltage U1 itself.

FIG. 2 does not show additional electrical components, such as are used for operating point adjustment, robustness measures and protective circuitry of the transistors in a manner known per se.

The control transistor T2 can connect the gate of the transistor T1 to the ground terminal 19 via the drain-source path of the control transistor T2. A gate of the control transistor T2 may be coupled or connected to the second electrical terminal 18. As a result, a voltage signal 30, which depends on the potential difference between the second terminal 18 and the ground terminal 19, drops as gate-source voltage of the control transistor T2. A measuring resistor 31 may be provided for picking up the voltage signal 30. Via a capacitor 32, the voltage signal 30 can be freed from voltage peaks to prevent false triggering of the switching device 29.

In the electrically conductive state of the control transistor T2, the gate of the transistor T1 is electrically connected to the ground terminal 19 such that the transistor T1 is switched to be electrically conductive. If the control transistor T2 is switched to the electrically blocking state, the potential of the gate of the transistor T1 is raised to the potential of the first terminal 17 via a pull-up resistor 33. As a result, the transistor T1 closes, that is, it is switched to the electrically blocking state. This interrupts the current flow of the supply current 11.

If now there is an interruption 26 of the electrical connection 20, a voltage transition occurs at the ground terminal 19, which leads from 0 volts (ground potential) to the supply voltage U2. Accordingly, there is a voltage change 35 for the voltage signal 30 from the second supply voltage U2 to 0 volts. Thus, the control transistor T2 is switched in the manner described from the electrically conductive state to the electrically blocking state and the current flow of the supply current 11 is interrupted by the transistor T1 in the manner described. This keeps the described feedback 27 from the first vehicle electrical system 11 to the second vehicle electrical system 12 via the ground conductive 21. By using the isolate gates of the transistor T1 and the transistor T2, the feedback 27 can not take place via the switching device 29.

To meet increased security requirements, the circuit can also be made redundant.

For testing purposes, i.e. for test triggering or test interruption, a further control transistor T2' can likewise be electrically connected to the gate of the transistor T2. As a result, for example, by means of a microcontroller 36, the switching device 29 can likewise be controlled so as to switch the transistor T1 to an electrically blocking state. Thus, the microcontroller can block the transistors T2 and the transistor T1 via 36 and interrupt the supply at the terminal 17 as a test. The microcontroller 36 can, for example, have a test device 37, for example a program module, in order to carry out a functional test of the switching device 29. The microcontroller 36 with the test device 37 thus represents a signal source for generating a switching signal for the switching device 29. Electrically, a resistor should be incorporated in the supply line to the gate of the transistor T2 downstream of the connection of the transistor T2' to protect the transistor T2' in the case of a test of protection against excessive currents.

However, in FIG. 2 as in other cases, most of the assistive components for operating point adjustment and component protection are not shown.

The circuit shown here thus only releases the 48 volt supply (U2 supply) as long as there is a positive voltage between the internal ground potential and the 12 volt supply (U1 supply). This ensures that when the ground is interrupted or interrupted briefly 26, the 48 volt supply cannot have a damaging effect on the remaining components The circuit is characterized by its low component requirements. In addition, it does not require any electrical supply to switch off and is therefore intrinsically safe. The circuit can be used with all types of power amplifiers. The controller may include 12 volt high side drivers, 12 volt lowside drivers, 48 volt highside drivers, and 48 volt lowside drivers. Such a driver may be formed, for example, by a half bridge and/or a B6 bridge. Likewise, all types of freewheeling diodes may be integrated.

Since the circuit device 29 can raise the potential of the controller at most to voltages that are already known and tested from pure 12 volt systems, the control unit requires no additional security measures. No potential separation and/or separate grounding is required. The circuit is therefore appreciated for the low effort it requires.

Overall, the example shows how an embodiment of the invention can provide a safety shutdown for 12V/48V controllers in the event of ground failures.

The invention claimed is:

1. A control device for a motor vehicle, comprising:
    a first electrical connection for receiving a first supply voltage of a first voltage source of a first electrical system of the motor vehicle;
    a second electrical connection for receiving a second supply voltage of a second voltage source of a second electrical system of the motor vehicle, the second supply voltage being smaller than the first supply voltage;
    an electrical ground connection for connecting a common ground potential of the first and the second electrical systems, wherein the electrical ground connection is provided so as to close a circuit of the first electrical system and the second electrical system; and
    a switching device set up downstream of the first electrical connection in order to block current flow through the first electrical connection depending on a voltage signal, which is determined by a potential difference between the second electrical connection and the electrical ground connection, wherein the switching device blocks the current flow so as to prevent an electrical connection via a ground conductive element between the first electrical connection and the second electrical connection and feedback induced thereby of the first supply voltage to the second electrical system if the voltage signal indicates an interruption of an electrical connection between the electrical ground connection and the common ground potential.

2. The control device according to claim 1, wherein the switching device is switched between the first electrical connection and a control output controlled by the control device for controlling an electrical apparatus of the first electrical system.

3. The control device according to claim 1, wherein the switching device for blocking the current flow comprises a transistor, the transistor being a MOSFET.

4. The control device according to claim 1, wherein the switching device for detecting the voltage signal comprises a control transistor between whose gate and source the voltage signal drops.

5. The control device according to claim 1, wherein the switching device is set up to receive from at least one further signal source a respective switching signal for switching the switching device independently of the potential difference via a respective control transistor.

6. The control device according to claim 5, wherein a test device is provided as the at least one further signal source for switching the switching device when a predetermined test condition independent of the potential difference is satisfied.

7. The control device according to claim 1, wherein the switching device comprises a capacitor between whose electrodes the voltage signal drops.

8. A motor vehicle, comprising:
a first vehicle electrical system, which uses a first electrical supply voltage;
a second vehicle electrical system, which uses a second electrical supply voltage which is smaller than the first electrical supply voltage;
a ground connection between the first and second vehicle electrical systems; and
a control device connected to the first vehicle electrical system and the second vehicle electrical system and the ground potential, the control device including a switching device configured to block current flow depending on a voltage signal, which is determined by a potential difference between a terminal in the second vehicle electrical system and the ground connection, wherein the switching device is further configured to block the current flow so as to prevent an electrical connection via a ground conductive element between the first and second vehicle electrical system and feedback induced thereby of the first electrical supply voltage to the second vehicle electrical system if the voltage signal indicates an interruption of an electrical connection between the ground connection and the ground potential.

9. A method for operating a control device for a motor vehicle, the method comprising:
receiving, by the control device via a first electrical connection, a first supply voltage of a first voltage source of a first electrical system of the motor vehicle;
receiving, by the control device via a second electrical connection, a second supply voltage of a second voltage source of a second electrical system of the motor vehicle, wherein the second supply voltage is smaller than the first supply voltage;
connecting, using an electrical ground connection, a common ground potential of the first and second electrical systems, wherein the electrical ground connection is provided so as to close a circuit of the first electrical system and the second electrical system; and
blocking, by a switching device of the control device connected downstream of the first electrical connection, a current flow through the first electrical connection, wherein the blocking depends on a voltage signal, the voltage signal being determined by a potential difference between the second electrical connection and the electrical ground connection,
wherein the switching device blocks the current flow to prevent an electrical connection via a ground conductive element between the first electrical connection and the second electrical connection and feedback induced thereby of the first supply voltage to the second electrical system upon detection of an interruption of an electrical connection between the electrical ground connection and the common ground potential.

10. The motor vehicle according to claim 8, wherein the switching device is switched between a first electrical connection of the first vehicle electrical system and a control output controlled by the control device for controlling an electrical apparatus of the first electrical system.

11. The motor vehicle according to claim 8, wherein the switching device for blocking the current flow comprises a transistor, the transistor being a MOSFET.

12. The motor vehicle according to claim 8, wherein the switching device for detecting the voltage signal comprises a control transistor between whose gate and source the voltage signal drops.

13. The motor vehicle according to claim 8, wherein the switching device is set up to receive from at least one further signal source a respective switching signal for switching the switching device independently of the potential difference via a respective control transistor.

14. The motor vehicle according to claim 13, wherein a test device is provided as the at least one further signal source for switching the switching device when a predetermined test condition independent of the potential difference is satisfied.

15. The motor vehicle according to claim 8, wherein the switching device comprises a capacitor between whose electrodes the voltage signal drops.

16. The method of claim 9, wherein the switching device is switched between the first electrical connection and a control output controlled by the control device for controlling an electrical apparatus of the first electrical system.

17. The method of claim 9, wherein the switching device for detecting the voltage signal comprises a control transistor between whose gate and source the voltage signal drops.

18. The method of claim 9, wherein the switching device is set up to receive from at least one further signal source a respective switching signal for switching the switching device independently of the potential difference via a respective control transistor.

19. The method of claim 18, wherein a test device is provided as the at least one further signal source for switching the switching device when a predetermined test condition independent of the potential difference is satisfied.

20. The method of claim 19, wherein the switching device comprises a capacitor between whose electrodes the voltage signal drops.

* * * * *